United States Patent
Salowe et al.

(10) Patent No.: US 7,100,129 B1
(45) Date of Patent: Aug. 29, 2006

(54) HIERARCHICAL GCELL METHOD AND MECHANISM

(75) Inventors: Jeffrey Scott Salowe, Cupertino, CA (US); Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 421 days.

(21) Appl. No.: 10/342,862

(22) Filed: Jan. 14, 2003

(51) Int. Cl.
*G06F 17/50* (2006.01)

(52) U.S. Cl. .................. 716/4; 716/5; 716/8; 716/11; 716/12; 716/13

(58) Field of Classification Search .................. 716/4, 716/8, 5, 11–13
See application file for complete search history.

(56) References Cited

U.S. PATENT DOCUMENTS

| | | | |
|---|---|---|---|
| 5,157,618 A | 10/1992 | Ravindra et al. | 716/16 |
| 5,281,558 A | 1/1994 | Bamji et al. | 716/2 |
| 5,481,473 A | 1/1996 | Kim et al. | 716/5 |
| 5,805,860 A | 9/1998 | Parham | 716/12 |
| 5,911,061 A | 6/1999 | Tochio et al. | 703/23 |
| 6,035,106 A | 3/2000 | Carruthers et al. | 716/11 |
| 6,253,363 B1 | 6/2001 | Gasanov et al. | 716/12 |
| 6,324,675 B1 | 11/2001 | Dutta et al. | 716/13 |
| 6,349,403 B1 | 2/2002 | Dutta et al. | 716/13 |
| 6,505,327 B1 | 1/2003 | Lin | 716/5 |
| 6,560,766 B1 | 5/2003 | Pierrat et al. | 716/19 |
| 6,625,611 B1 | 9/2003 | Teig et al. | 716/17 |
| 6,701,306 B1 | 3/2004 | Kronmiller et al. | 707/2 |
| 6,785,874 B1 | 8/2004 | Tsukuda | 716/5 |
| 2002/0059194 A1 | 5/2002 | Choi et al. | 707/3 |
| 2004/0044980 A1 | 3/2004 | Juengling | 716/17 |

OTHER PUBLICATIONS

Ahuja, R.K. et al., eds., *Network Flows. Theory, Algorithms, and Applications* (1993) pp. 510-542, Prentice Hall, Upper Saddle River, NJ.

Al-Yamani, A. et al. "HPTS: Heterogeneous Parallel Tabu Search for VLSI Placement" *Proceedings of the 2002 Congress on Evolutionary Computation* (May 12-17, 2002) 1:351-355.

Anderson, R. et al. "An O(n log n) Algorithm for 1-D Tile Compaction" *ICCAD-89—International Conference on Computer-Aided Design* (Nov. 5-9, 1989) pp. 144-147.

Balasa, F. et al. "Efficient Solution Space Exploration Based on Segment Trees in Analog Placement with Symmetry Constraints" in *IEEE/ACM International Conference on Computer Aided Design* (Nov. 10-14, 2002) pp. 497-502.

Barzaghi, M. et al. "Hierarchical Management of VLSI Cells at Different Description Levels" *Proceedings of the 6th Mediterranean Electrotechnical Conference* (May 22-24, 1991) 1:327-330.

Benetis, R. et al. "Nearest Neighbor and Reverse Nearest Neighbor Queries for Moving Objects" *Proceedings of the International Database Engineering and Applications Symposium (IDEAS'02)* (Jul. 17-19, 2002) pp. 44-53.

Bern, J. et al. "Some Heuristics for Generating Tree-like FBDD Types" *IEEE Transactions on Computer-Aided Design of Integrated Circuits and Systems* (Jan. 1996) 15(1):127-130.

(Continued)

*Primary Examiner*—Sun James Lin
(74) *Attorney, Agent, or Firm*—Bingham McCutchen LLP

(57) ABSTRACT

A method of analyzing a design of an electronic circuit includes tessellating the design into a grid of rectangles, selecting at least one rectangle as a first level parent rectangle, and generating a plurality of second level child rectangles based on the first level parent rectangle.

42 Claims, 5 Drawing Sheets

OTHER PUBLICATIONS

Bhattacharya, S. and W.-T. TSAI "Area Efficient Binary Tree Layout" *1st Great Lakes Symposium on VLSI* (Mar. 1-2, 1991) pp. 18-24.

Blust, G. and D.P. Mehta "Comer Stitching for L-shaped Tiles" *Proceedings of the 3rd Great Lakes Symposium on VLSI, Design Automation of High Performance VLSI Systems* (Mar. 5-6, 1993) pp. 67-68.

Borah, M. et al. "An Edge-Based Heuristic for Steiner Routing" *IEEE Transactions on Computer-Aided Design of Integrated Circuits and Systems* (Dec. 1994) 13(12):1563-1568.

Brüuck, R. and H. Wronn "-geoADDICTION—Flexible Handling of Geometries in IC-Layout Tools" *ISCAS '88—IEEE International Symposium on Circuits and Systems* (Jun. 7-9, 1988) 1:723-726.

Cadence Design Systems, Inc. *IC Shape-Based Technology Chip Assembly User Guide* Product Version 11.0 (Nov. 2001).

Carlson, E.C. and R.A. Rutenbar "A Scanline Data Structure Processor for VLSI Geometry Checking" *IEEE Transactions on Computer-Aided Design* (Sep. 1987) 6(5):780-794.

Cheung, P. and J. Hesketh "Design Automation Tools for Tile-Based Analogue Cells" *IEE Colloquium on New Directions in VLSI Design* (Nov. 27, 1989) pp. 3/1-3/5.

Chiang, C. and C.-S. Chiang "Octilinear Steiner Tree Construction" *MWSCAS-2002—The 2002 45th Midwest Symposium on Circuits and Systems* (Aug. 4-7, 2002) 1:603-606.

Christian, B.S. et al. "A VLSI Interval Router for High-Speed Networks" *Canadian Conference on Electrical and Computer Engineering* (May 26-29, 1996) 1:154-157.

Cong, J. et al. "Multilevel Approach to Full-Chip Gridless Routing" *ICCAD 2001—IEEE/ACM International Conference on Computer-Aided Design* (Nov. 4-8, 2001) pp. 396-403.

Curatelli, F. et al. "Efficient Management of Complex Elements in Physical IC Design" *Proceedings of the IEEE International Symposium on Circuits and Systems* (May 1-3, 1990) 1:456-459.

Das, S. and B.B. Bhattacharya "Channel Routing in Manhattan-Diagonal Model" *Proceedings of the 9th International Conference on VLSI Design* (Jan. 3-6, 1996) pp. 43-48.

Dasgupta, P. et al. "Multiobjective Search in VLSI Design" *Proceedings of the 7th International Conference on VLSI Design* (Jan. 1994) pp. 395-400.

Dasgupta, P. et al. "Searching Networks with Unrestricted Edge Costs" *IEEE Transactions on Systems, Man and Cybemetics-Part A: Systems and Humans* (Nov. 2001) 31(6):497-507.

Dijkstra, E.W. "A Note on Two Problems in Connexion with Graphs" *Numerische Mathematik* (1959) 1:269-271.

de Dood, P. et al. "A Two-Dimensional Topological Compactor With Octagonal Geometry" *28th ACM/IEEE Automation Conference* (1991) pp. 727-731.

Doong, K. Y.-Y. et al. "Infrastructure Development and Integration of Electrical-Based Dimensional Process Window Checking" *IEEE Transactions on Semiconductor Manufacturing* (May 2004) 17(2):123-141.

Dutt, S. "New Faster Kemighan-Lin-Type Graph-Partitioning Algorithms" *ICCAD-93—1993 IEEE/ACM International Conference on Computer-Aided Design* (Nov. 7-11, 1993) pp. 370-377.

Facanha, H.S. et al. "Layout Tool for High Speed Electronic and Optical Circuits" *IEE Colloquium on Analogue IC Design: Obstacles and Opportunities* (Jun. 18, 1990) pp. 3/1-3/5.

Facanha, H.S. et al. "Data structures for physical representation of VLSI" *Software Engineering Journal* (Nov. 1990) 5(6):339-349.

Fang, J.P. and S.J. Chen "Tile-Graph-Based Power Planning" *ISCAS'03—Proceedings of the 2003 International Symposium on Circuits and Systems* (May 25-28, 2003) 5:V-501-V-504.

Faroe, O. et al. "Local Search for Final Placement in VLSI Design" *ICCAD 2001—IEEE/ACM International Conference on Computer-Aided Design* (Nov. 4-8, 2001) pp. 565-572.

Gannett, J.W. "Shortfinder: A Graphical CAD Tool for Locating Net-to-Net Shorts in VLSI Chip Layouts" *IEEE Transactions on Computer-Aided Design* (Jun. 1990) 9(6):669-674.

Grgek, M. et al. "Performance Comparison of Several Data Structures for Storing VLSI Geometry" *The IEEE Region 8 EUROCON 2003, Computer as a Tool* (Sep. 22-24, 2003) 1:156-159.

Guibas, L.J. and J. Stolfi "On Computing All North-East Nearest Neighbors in the $L_1$ Metric" *Information Processing Letters* (Nov. 8, 1983) 17:219-223.

Hettiaratchi, S. and P.Y.K. Cheung "A novel implementation of tile-based address mapping" *DATE'04—Proceedings of the Design, Automation and Test in Europe Conference and Exhibition* (Feb. 16-20, 2004) 1:306-310.

Hsiao, P.-Y. and W.-S. Feng "Using a Multiple Storage Quad Tree on a Hierarchical VLSI Compaction Scheme" *IEEE Transactions on Computer-Aided Design* (May 1990) 9(5):522-536.

Hsiao, P.-Y. et al. "Optimal tile partition for space region of integrated circuits geometry" *IEEE Proceedings-E* (May, 1993) 140(3):145-153.

Hur, S.-W. and J. Lillas "Relaxation and Clustering in a Local Search Framework: Application to Linear Placement" *Proceedings of the 36h Design Automation Conference* (Jun. 21-25, 1999) pp. 360-366.

Hwang, F.K. "An O(n log n) Algorithm for Rectilinear Minimal Spanning Trees" *J ACM* (Apr. 1979) 26(2):177-182.

Iwasaki, H. et al. "An Effective Data Structure for VLSI Layout Systems" *Proceedings of the IEEE International Symposium on Circuits and Systems* (Jun. 11-14, 1991) 5:3134-3137.

Johann, M. and R. Reis "Net by Net Routing with a New Path Search Algorithm" *Proceedings of the 13th Symposium on Integrated Circuits and Systems Design* (Sep. 18-24, 2000) pp. 144-149.

Kiyota, K. and K. Fujiyoshi "Simulated Annealing Search Through General Structure Floorplans Using Sequence-Pair" *ISCAS 2000—Proceedings of the 2000 IEEE International Symposium on Circuits and Systems*, Geneva, Switzerland (May 28-31, 2000) 3:77-80.

Koh, C.-K. and P.H. Madden "Manhattan or Non-Manhattan? A Study of Alternative VLSI Routing Architectures" *Proceedings of the 10th Great Lakes Symposium on VLSI* (Mar. 2000) pp. 47-52.

Kruskal, Jr., J.B. "On the Shortest Spanning Subtree of a Graph and the Traveling Salesman Problem" *Proc. Amer. Math. Soc.* (1956) pp. 48-50.

Ku, L.-P. and H.W. Leong "Note on optimal tile partition for space region of integrated-circuit geometry" *IEE Proceedings on Computers and Digital Techniques* (Jul. 1996) 143(4):246-248.

Kubo, Y. et al. "Self-Reforming Routing for Stochastic Search in VLSI Interconnection Layout" *Proceedings of the ASP-DAC 2000 Asia South Pacific Design Automation Conference* (Jan. 25-28, 2000) pp. 87-92.

Kuh, E.S. and T. Ohtsuki "Recent Advances in VLSI Layout" *Proceedings of the IEEE* (Feb. 1990) 78(2):237-263.

Kunii, T.L. et al. "Hierarchic Shape Description via Singularity and Multiscaling" *COMPSAC 94—Proceedings of the 18th Annual International Computer Software and Applications Conference* (Nov. 9-11, 1994) pp. 242-251.

Lai, G.G. et al. "Hinted Quad Trees for VLSI Geometry DRC Based on Efficient Searching for Neighbors" *IEEE Transactions on Computer-Aided Design of Integrated Circuits and Systems* (Mar. 1996) 15(3):317-324.

Lai, Y.-K. et al. "An Efficient Array Architecture with Data-Rings for 3-Step Hierarchical Search Block Matching Algorithm" *1997 IEEE International Symposium on Circuits and Systems, Hong Kong* (Jun. 9-12, 1997) 2:1361-1364.

Liao, S. et al. "An Efficient External-Memory Implementation of Region Query with Application to Area Routing" *(ICCD'02)—Proceedings of the 2002 IEEE International Conference on Computer Design: VLSI in Computers and Processors* (Sep. 16-18, 2002) pp. 36-41.

Lin, Y.-L. et al. "Routing Using a Pyramid Data Structure" *ICCAD-89—1989 International Conference on Computer-Aided Design* (Nov. 5-9, 1989) pp. 436-439.

Lin, Y.-L. et al. "Hybrid Routing" *IEEE Transactions on Computer-Aided Design* (Feb. 1990) 9(2):151-157.

Linhares, A. "Synthesizing a Predatory Search Strategy for VLSI Layouts" *IEEE Transactions on Evolutionary Computation* (Jul. 1999) 3(2):147-152.

Lodha, S.K. and D. Bhatia "Bipartitioning Circuits using TABU Search" *Proceedings of the 11th Annual IEEE International ASIC Conference* (Sep. 13-16, 1998) pp. 223-227.

Luk, W.K. and A.A. Dean "Multistack Optimization for Data-Path Chip Layout" *IEEE Transactions on Computer-Aided Design* (Jan. 1991) 10(1):116-129.

Margarino, A. et al. "A Tile-Expansion Router" *IEEE Transactions on Computer-Aided Design* (Jul. 1987) 6(4):507-517.

Marple, D. et al. "Tailor: A Layout System Based on Trapezoidal Corner Stitching" *IEEE Transactions on Computer-Aided Design* (Jan. 1990) 9(1):66-90.

Mehta, D. and G. Blust "Corner Stitching for Simple Rectilinear Shapes" *IEEE Transactions on Computer-Aided Design of Integrated Circuits and Systems* (Feb. 1997) 16(2):186-198.

van der Meijs, N.P. and A.J. van Genderen "Space-Efficient Extraction Algorithms" *Proceedings of the 3rd European Conference on Design Automation* (Mar. 16-19, 1992) pp. 520-524.

van der Meijs, N.A. and A.J. van Genderen "An Efficient Algorithm for Analysis of Non-Orthogonal Layout" *ISCAS '89—IEEE International Symposium on Circuits and Systems* (May 8-11, 1989) 1:47-52.

Modarres, H. and R.J. Lomax "A Formal Approach to Design-Rule Checking" *IEEE Transactions on Computer-Aided Design* (Jul. 1987) 6(4):561-573.

Nakatake, S. et al. "Consistent Floorplanning with Hierarchical Superconstraints" *IEEE Transactions on Computer-Aided Design of Integrated Circuits and Systems* (Jan. 2002) 21(1):42-49.

Öten, R. and R. J.P. de Figueiredo "Topological Dimensionality Determination and Dimensionality Reduction Based on Minimum Spanning Trees" *ISCAS '98—Proceedings of the 1998 IEEE International Symposium on Circuits and Systems* (May 31-Jun. 3, 1998) 3:366-369.

Pitaksanonkul, A. et al. "Comparisons of Quad Trees and 4-D Trees: New Results" *IEEE Transactions on Computer-Aided Design* (Nov. 1989) 8(11):1157-1164.

Powers, K.D. et al. "The 60° Grid: Routing Channels in Width $d/\sqrt{3}$" *Proceedings of the 1st Great Lakes Symposium on VLSI* (Mar. 1-2, 1991) pp. 214-219.

Preparata, F.P. and M.I. Shamos, *Computational Geometry An Introduction* (1985) Springer-Verlag New York Inc.

Prim, R.C. "Shortest Connection Networks and Some Generalizations" *The Bell System Technical Journal* (Nov. 1957) 36(6):1389-1401.

Rothermel, H.-J. and D.A. Mlynski "Automatic Variable-Width Routing for VLSI" *IEEE Transactions on Computer-Aided Design* (Oct. 1983) 2(4):271-284.

Sait, S.M. et al. "Performance and Low Power Driven VLSI Standard Cell Placement using Tabu Search" *CED '02—Proceedings of the 2002 Congress on Evolutionary Computation* (May 12-17, 2002) 1:372-377.

Sakanushi, K. and Y. Kajitani "The Quarter-State Sequence (Q-sequence) to Represent the Floorplan and Applications to Layout Optimization" *IEEE APCCAS 2000—The 2000 IEEE Asia-Pacific Conference on Circuits and Systems* (Dec. 4-6, 2000) pp. 829-832.

Salek, A.H. et al. "Hierarchical Buffered Routing Tree Generation" *IEEE Transactions on Computer-Aided Design of Integrated Circuits and Systems* (May 2002) 21(5):554-567.

Sarrafzadeh, M. et al. "Single-Layer Global Routing" *IEEE Transactions on Computer-Aided Design of Integrated Circuits and Systems* (Jan. 1994) 13(1):38-47.

Schmiedle, F. et al. "Exact Routing with Search Space Reduction" *IEEE Transactions on Computers* (Jun. 2003) 52(6):815-825.

Séquin, C.H. and H. da Silva Facanha "Corner-Stitched Tiles with Curved Boundaries" *IEEE Transactions on Computer-Aided Design of Integrated Circuits and Systems* (Jan. 2003) 12(1):47-58.

Serdar, T. and C. Sechen "Automatic Datapath Tile Placement and Routing" *Conference and Exhibition on Design, Automation and Test in Europe* (Mar. 13-16, 2001) pp. 552-559.

Sim, S.-P. et al. "Analytical Capacitance Model for High-Speed Interconnects with Diagonal Routing" *Proceedings of the IEEE 2002 International Interconnect Technology Conference* (Jun. 3-5, 2002) pp. 157-158.

Su, S.J. and Y.S. Kuo "Multicell Quad Trees" *Proceedings of the 3rd European Conference on Design Automation* (Mar. 16-19, 1992) pp. 147-151.

Sun, P.K. "An Octagonal Geometry Compactor" *Proceedings of the 1998 IEEE International Conference on Computer Design: VLSI Computers and Processors—ICCD'88* (Oct. 3-5, 1988) pp. 190-193.

Suzuki, G. et al. "MOSAIC: A Tile-Based Datapath Layout Generator" *ICCAD-92—1992 IEEE/ACM International Conference on Computer-Aided Design* (Nov. 8-12, 1992) pp. 166-170.

Tan, X. and X. Song "Improvement on the diagonal routing model" *IEEE Proceedings on Circuits, Devices and Systems* (Dec. 1994) 141(6):535-536.

Tarjan, R.E., ed. *Data Structures and Network Algorithms* Society for Industrial and Applied Mathematics, Philadelphia, PA (1983) pp. 71-83.

Tsai, C.-C. et al. "An H-V Alternating Router" *IEEE Transactions on Computer-Aided Design* (Aug. 1992) 11(8):976-991.

Tseng, H.-P. and C. Sechen "A Gridless Multi-Layer Router for Standard Cell Circuits using CTM Cells" *ED&TC 97—Proceedings of the European Design and Test Conference* (Mar. 17-20, 1997) pp. 319-326.

Tseng, H.-P. and C. Sechen "A Gridless Multilayer Router for Standard Cell Circuits Using CTM Cells" *IEEE Transactions on Computer-Aided Design of Integrated Circuits and Systems* (Oct. 1999) 18(10):1462-1479.

Tzionas, P.G. et al. "A New, Cellular Automaton-Based, Nearest Neighbor Pattern Classifier and its VLSI Implementation" *IEEE Transactions on Very Large Scale Integration (VLSI) Systems* (Sep. 1994) 2(3):343-353.

Wu, G.-M. et al. "Rectilinear Block Placement Using B*-Trees" *Proceedings of the International Conference on Computer Design* (Sep. 17, 2000) pp. 351-356.

Xing, Z. and R. Kao "Shortest Path Search Using Tiles and Piecewise Linear Cost Propagation" *IEEE Transactions on Computer-Aided Design of Integrated Circuits and Systems* (Feb. 2002) 21(2):145-158.

Xu, N. et al. "TSCSP: Tabu Search Algorithm for VLSI Module Placement Based on the Clustering Sequence-Pair" *5th International Conference on ASIC* (Oct. 21-24, 2003) 1:306-310.

Yamazaki, H. et al. "Optimum Packing of Convex-Polygons by a New Data Structure Sequence-Table" *IEEE APCCAS 2000—The 2000 IEEE Asia-Pacific Conference on Circuits and Systems* (Dec. 4-6, 2000) pp. 821-824.

Yan, Z. et al. "Area Routing Oriented Hierarchical Corner Stitching with Partial Bin" *Proceedings of the ASP-DAC 2000 Asia-South Pacific Design Automation Conference* (Jan. 25-28, 2000) pp. 105-110.

Yu, Z. et al. "Layout-based 3D Solid Modeling for IC" *Proceedings of the 1995 International Symposium on VLSI Technology, Systems and Applications* (May 31-Jun. 2, 1995) pp. 108-112.

Zhang, Y. et al. "A Gridless Router Based on Hierarchical PB Corner Stitching Stucture" *IEEE 2002 International Conference on Communications, Circuits and Systems and West Sino Expositions* (Jun. 29-Jul. 1, 2002) 2:1438-1443.

Zheng, S.-Q. et al. "Efficient Maze-Running and Line-Search Algorithms for VLSI Layout" *Proceedings of the IEEE Southeastcon '93* (Apr. 4-7, 1993) 7 p.

Zheng, S.Q. et al. "Finding Obstacle-Avoiding Shortest Paths Using Implicit Connection Graphs" *IEEE Transactions on Computer-Aided Design of Integrated Circuits and Systems* (Jan. 1996) 15(1):103-110.

Zheng, S.Q. et al. "Routing Using Implicit Connection Graphs" *9th International Conference on VLSI Design* (Jan. 3-6, 1996) pp. 49-52.

Hu, J. et al. "A Survey on Multi-net Global Routing for Integrated Circuits" (1998), pp. 1-68, located at http://www.ece.umn.edu/users/sachin/PUBS/integration01.pdf.

HIERARCHICAL GCELL METHOD AND MECHANISM

FIELD OF THE INVENTION

The present invention relates generally to electronic circuit design and manufacturing, and more particularly to wire routing using an integrated circuit design automation system.

BACKGROUND OF THE INVENTION

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

After the layout is complete, it is then checked to ensure that it meets the design requirements. The result is a set of design files, which are then converted into pattern generator files. The pattern generator files are used to produced patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

Conventional routing programs perform either grid-based routing or shape-based routing. During grid-based routing, wires are routed along defined and equally spaced grid lines of a grid array. Grid lines of the grid array are used in the routing process to speed up the process of finding the wire routing solutions by reducing the number of pathways to consider for routing. The grid-based router, however, has several drawbacks.

A disadvantage of the grid-based router is that it is difficult for a grid-based router to route with circuit blocks that do not have a signal-defined grid array. Modern IC and circuit board designs typically include circuit blocks having different dimension grid arrays. As a result, the grid-based router may not be able to match pins of different blocks with different dimension grid arrays. Another disadvantage of the grid-based router is that it is very inflexible, because it is highly dependent on wire length, wire width, and wire separation, and not on a predefined wire grid array. Therefore, for example, forcing wires to lie on predefined grid lines may not optimally address the greater underlying problem of signal delay. Another problem of the grid-based router is that it tends to waste a large percentage of routable area within an integrated circuit substrate.

A shape-based router is an example of a gridless router. Because the gridless router is not directly tied to a predefined grid array, it alleviates some of the grid-based router's disadvantages. The shape-based router, however, has its own problems. For example, known approaches to implementing this type of gridless router use a non-hierarchical data model that tends to consume an excessive amount of computing resources and slows down performance speed. In addition, its non-hierarchical data model also increases the difficulty of designing modern complex integrated circuits.

For example, in order to perform chip routing efficiently, an abstract graph called the routing graph is constructed. However, the routing graph is non-hierarchical. For example, in order to get more rectangles in a particular region, the distance between neighboring lines is reduced. However, this unnecessarily decreases the size of any rectangle that is bordered by these lines.

Although conventional grid-based routers and shape-based routers have been adequate to serve the routing process for IC designs, new IC routing technology is required because semiconductor fabrication process advancements are antiquating current technologies. Moreover, customers are continually demanding lower manufacturing costs, higher speed, more capacity, more capability, and increased performance from their routers.

SUMMARY OF THE INVENTION

In one embodiment, a method of analyzing a design of an electronic circuit may include using a hierarchy of gcells. A gcell may be a tessellation, a portion, a partition, or a window that may be created in the design of the electronic circuit or the chip layout. The hierarchy of gcells may be generated by tessellating the design into a grid of rectangles, selecting at least one rectangle as a first level parent rectangle, generating a plurality of second level child rectangles based on the first level parent rectangle. In an embodiment, a method of analyzing an electronic design may include using edge or via gcells. An edge gcell may be generated by tessellating a first layer of the design into a plurality of rectangles, associating a vertex and edges with each rectangle, identifying an edge shared by neighboring rectangles, and associating a vertex with the shared edge.

Other and additional objects, features, and advantages of the invention are described in the detailed description, figures, and claims.

DETAILED DESCRIPTION

A method of analyzing a design of an electronic circuit may include using a hierarchy of gcells. A gcell may be a tessellation, a portion, a partition, or a window that may be created in the design of the electronic circuit or the chip layout. The hierarchy of gcells may be generated by tessellating a dual graph of the design into a grid of rectangles, selecting at least one rectangle as a first level parent rectangle, generating a plurality of second level child rectangles based on the first level parent rectangle. The hierarchical representation can be used to represent dual graphs that use different rectangle sizes in different areas. For example, the hierarchy of gcells may permit the dual graph to have more vertices in complicated areas of the electronic design, without having to allocate storage for corresponding edge representations. Hierarchical gcells also allow possibility of different size grids on different layers.

Another method of analyzing an electronic design may include using edge or via gcells. An edge gcell may be generated by tessellating a first layer of a dual graph of the design into a plurality of rectangles. A boundary shared by neighboring rectangles is identified, and a vertex is used to represent the shared boundary. Representing shared boundaries as vertices in the dual graph simplifies accounting for effects at the boundary of rectangles. For example, in a maximum flow analysis, a one dimensional vertex from a shared edge gcell may be used to indicate the number of wires that cross the edge, instead of using a two dimensional gcell.

Figure 1:
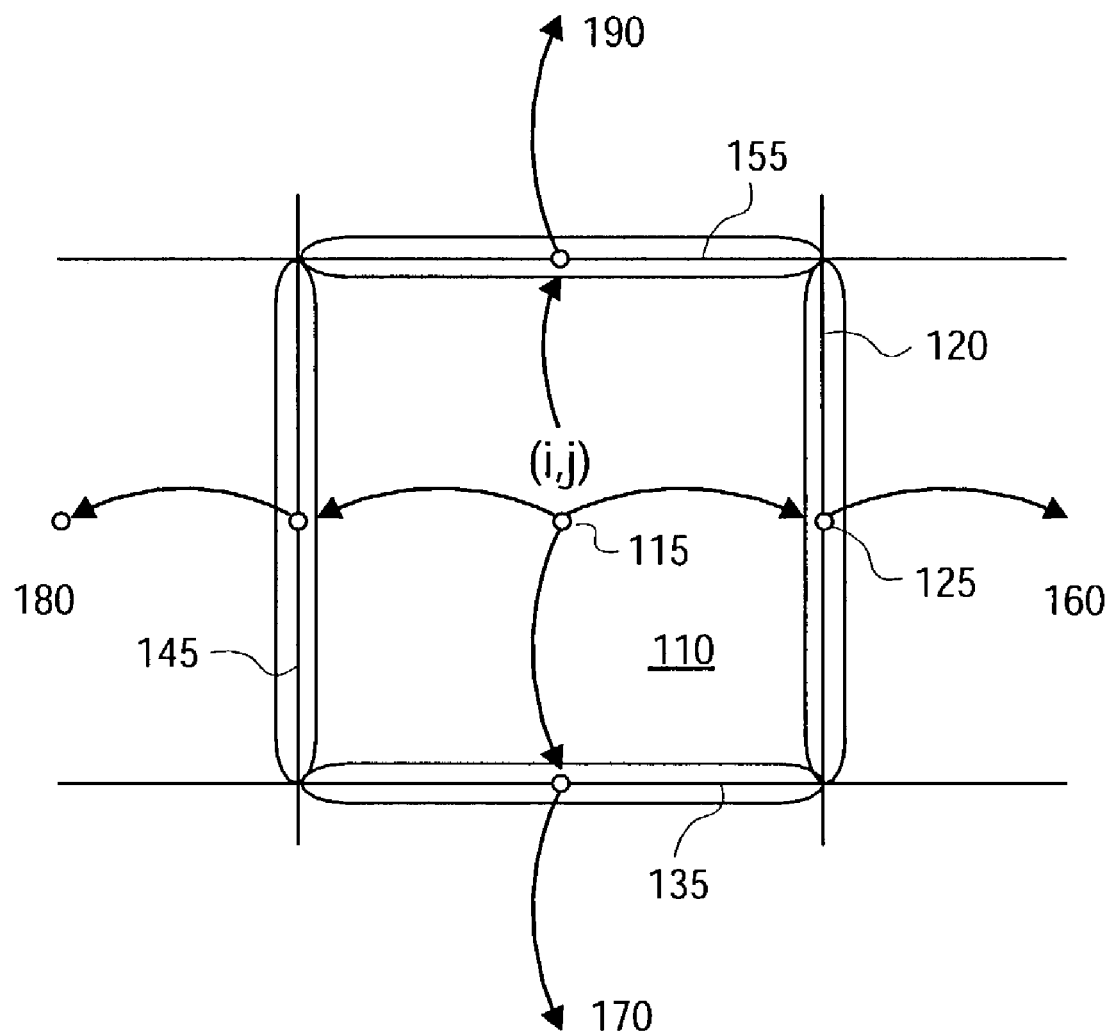
FIG. 1 shows an example of a dual graph including one and two dimensional gcells.

As shown in FIG. 1, the vertices of the dual graph may include two dimensional pieces, such as rectangle 110 for example, the one dimensional edges, such as edge 120 for example, and a shared boundary between two layers, such as a via for example. The rectangle 110 is a gcell represented as a vertex 115 and edges 120, 135, 145, and 155. The vertex has coordinates (i, j) which correspond to the location of the center of the gcell. Each edge may represent a shared border with a neighboring gcell. For example, edge 120 is a shared border between gcell 110 and gcell 160.

Edge 120 corresponds to a one dimensional object in the tessellation. Edge 120 is one dimensional, because it has no width. The edge 120 may be represented as a one dimensional edge gcell by vertex 125. The vertex 125 may have coordinates which correspond to the location of the center of the edge gcell. Representing shared boundaries as vertices in the dual graph simplifies accounting for effects at the boundary of rectangles. For example, in a maximum flow analysis, the edge gcell may be used to indicate the number of wires that cross the edge 120, in which case a two dimensional gcell is unnecessary. A three dimensional graph may be used to tessellate, or divide, the layers of the electronic design into rectangular blocks. A block on a lower layer and a block on an upper layer may share a two dimensional rectangular edge. The shared edge between the blocks on the lower and upper layers may be represented as a two dimensional via gcell to simplify the accounting for effects at the boundary of the blocks. For example, in a maximum flow analysis, the two dimensional shared rectangular edge may be used to indicate the number of wires that can cross the edge and provide a via from one layer to another. The two dimensional shared edge may be represented by a vertex and the rectangular edges.

Figure 2:
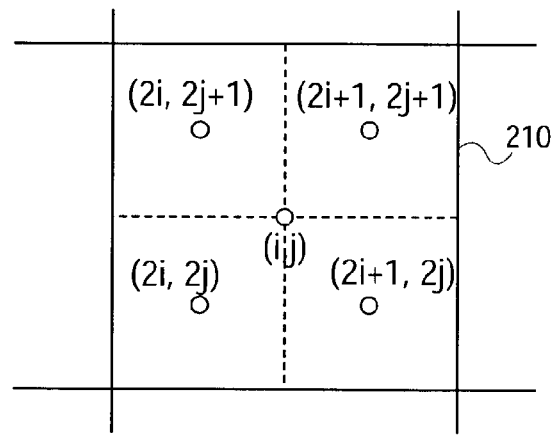
FIG. 2 shows an example of hierarchical gcells.
Figure 2:
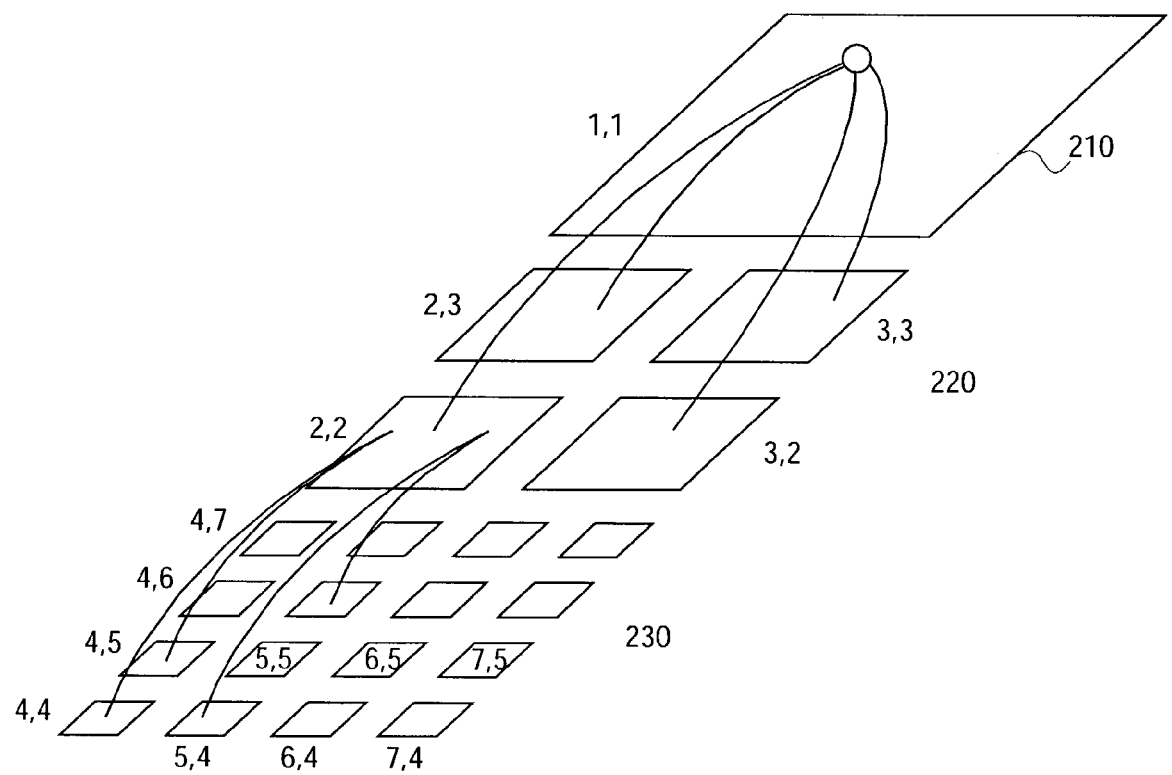

As shown in FIG. 2, the gcells may be hierarchical. For example, a gcell 210 may be partitioned into several smaller gcells 220. The original gcell 210 may be called the parent, and the smaller gcells 220 may be called the children. The parent is on one level of the hierarchy, and the children are on another level. The hierarchy of gcells permits the dual graph to have more vertices in complicated areas of the electronic design, without having to allocate storage for corresponding edge representations. The rectangles in a layer of the graph may have different sizes and more than one neighbor on the boundary, but no explicit neighbor list is needed. For example, this may be done with an indexing scheme that maps the gcell grid to an array which can be used to find neighbors, children, or parents in a single step. The hierarchical representation can be used to represent dual graphs that use different rectangle sizes in different areas. Hierarchical gcells also allow possibility of different size grids on different layers.

In general, a level k partition is a $4^k$-way partition formed by $2^k-1$ vertical and $2^k-1$ horizontal lines, equally spaced on each side. On each level, a rectangle has up to six neighbors, north, south, east, west, up, and down. A rectangle r on level k has one parent, the rectangle on level k−1 that contains it, and up to four children, the rectangles on level k+1 that have r as parent.

Rectangles are indexed in the following way. A level zero rectangle is rectangle index (1, 1). The rectangles on level k have indices (i, j) where $2^k <= i < 2^{(k+1)}$ and $2^k <= j < 2^{(k+1)}$. The parent of (i, j) is (i/2, j/2), where the division by 2 is an integer division. The west neighbor of (i, j) on its level is (i−1, j), and so on. The indexing can be used to determine neighboring gcells, because the gcell grid is mapped internally to an array. With the index scheme, a neighbor may be determined without having a pointer to the neighbor.

An example of a partitioning and indexing a layer is shown in FIG. 2. To increase resolution locally, a gcell may be subdivided, and child gcells may be instantiated. The child gcells may also be subdivided and instantiated. The level zero partition 210 is on the layer of the design. The level one partition 220 is a quad-partitioning of the layer into four gcell pieces by two lines, one horizontal and one vertical, intersecting at the center of the gcell. The level two partition 230 is a sixteen-way partition formed by dividing each level one gcell into four gcells, equally spaced on each side.

As shown in FIG. 2, a hierarchy of gcells may be present simultaneously. The gcell (i, j) on level k, 210, is subdivided into four pieces to form k+1 level gcells (2i, 2j+1), (2i+1, 2j+1), (2j, 2j), and (2i+1, 2j). The four pieces have a mapping of indices that describes the hierarchy. With the original, or parent gcell, the gcells that are present and their neighbors may be determined with the indexing scheme. The parent and child relationships may also be determined with the indexing scheme.

The edges of the rectangles, and the bottom and top of the rectangles, are indexed in the following way. The west edge of (i, j) is indexed (i−1, j). The south edge of (i, j) is indexed (i, j−1), as is the down via corresponding to (i, j). Using this scheme, all dual graph vertices and edges are accessible without the storage of explicit pointers. For example, as shown in FIG. 2, at the second level 230, the index is (4, 4). The parent is 2, 2, which is determined from the division of index 4, 4 by two. The neighboring gcells on level two have the same properties they would have in a normal gcell. However, the level two gcells have a virtual presence, because they are not actually produced.

The level zero, one, and two graphs exist simultaneously. Because the graphs are hierarchical, the level zero graph has the lowest resolution of the three graphs, and the level two graph has the highest resolution. This simultaneous existence with varying degrees of resolution allows a route from 1, 1 to 15, 15 on the third level to use the level zero graph to avoid walking through the numerous gcells of the level two graph. Also, if increased resolution is desired, the level one or level two graphs may be used. The finer granularity is desirable if the level zero gcell contains a large number of obstructions. Determining free and used spaces with a coarse gcell may therefore be more difficult than determining the free and used spaces with multiple smaller gcells.

Figure 3:
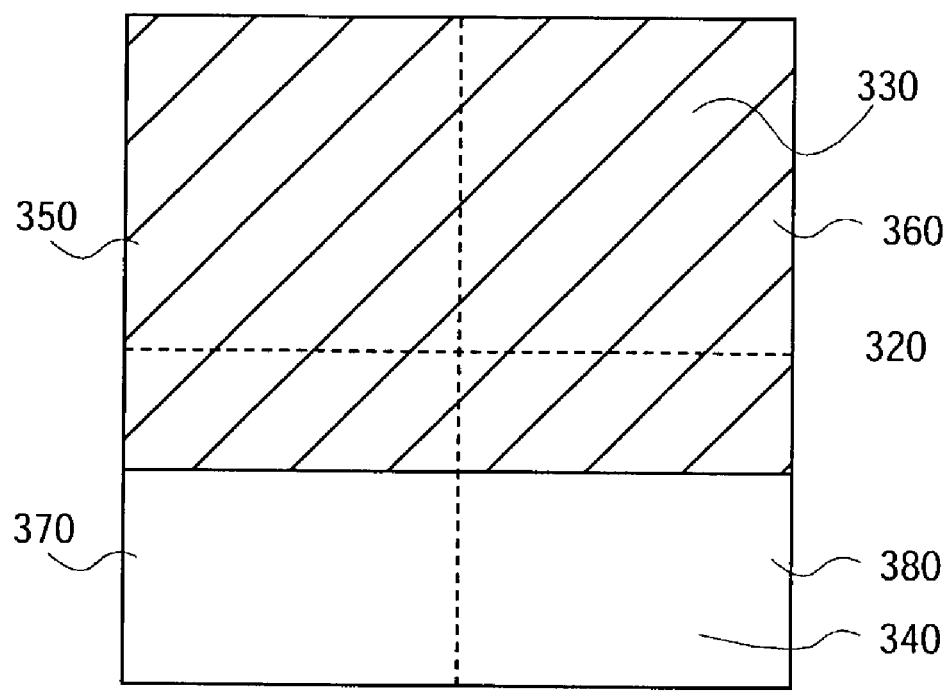
FIG. 3 shows another example of hierarchical gcells.
Figure 3:
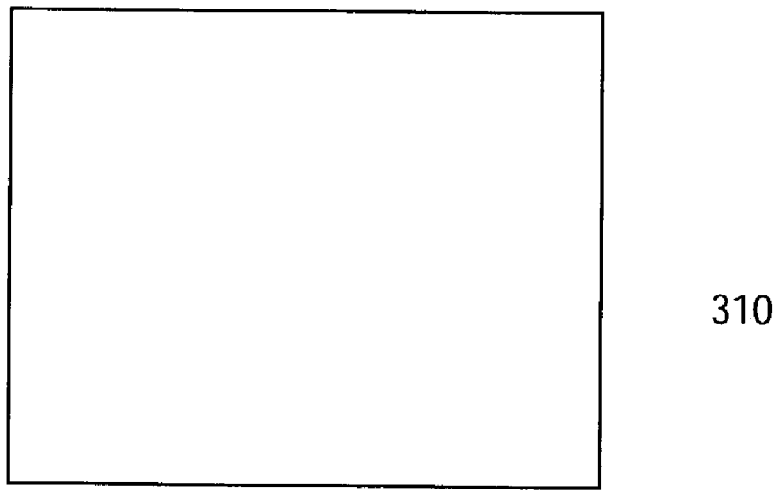

FIG. 3 shows another example of hierarchical gcells. A gcell (i, j) 310 is on metal layer one of an electronic design. Another gcell (i, j) 320 is on metal layer two, and contains an obstruction 330. A coarse analysis of the gcell on metal two indicates that this gcell contains enough free space for a via to be placed from i, j on metal one to metal two. However, the resolution of the gcell 320 is too low to determine the location of the free space 340. The gcell 320 may be subdivided to increase the resolution into gcells 350, 360, 370, and 380. Two of the gcells on level two, cells 350 and 360, are completely blocked by the obstruction 330. Therefore, placing a via in either of the gcells 350, 360 of level two is illegal. The lower two gcells 370, 380, have both free space 340 and used space 330. The resolution of these gcells may be increased by subdividing these gcells 370, 380 into a level three grid. The level three gcells may contain gcells that are completely free of obstructions. If so, the via may be placed in these gcells. The gcells allow complicated regions to have more visibility, which increases the amount of space available for an electronic design.

Figure 4:
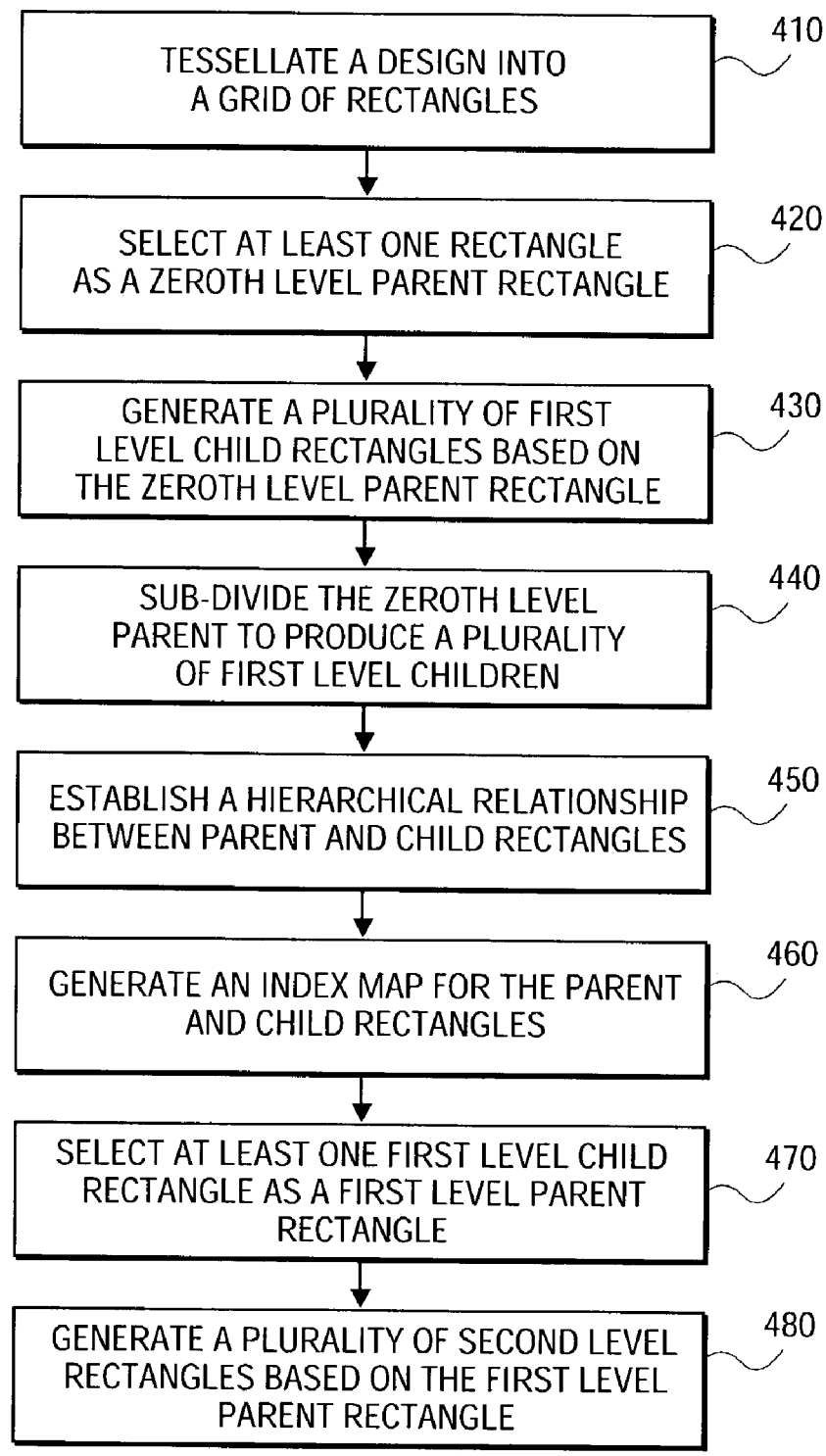
FIG. 4 shows an example of a method of partitioning and indexing a layer with hierarchical gcells.

FIG. 4 shows an example of a method of partitioning and indexing a layer with hierarchical gcells. The method tessellates a design into a grid of rectangles, 410. At least one rectangle is selected as a zeroth level parent rectangle, 420. A plurality of first level child rectangles is generated based on the zeroth level parent rectangle, 430. Generating the child rectangles may include sub-dividing the zeroth level parent rectangle to produce a plurality of first level child rectangles, 440, and establishing a hierarchical relationship between the zeroth level parent rectangle and the first level child rectangles, 450. The hierarchical relationship may be established by generating an index map n for the zeroth level parent rectangle, 460, and generating an index map 2n for the first level child rectangles. At least one first level child rectangle may be selected as a first level parent rectangle, 470. A plurality of second level child rectangles based on the first level parent rectangle may be generated, 480.

Figure 5:
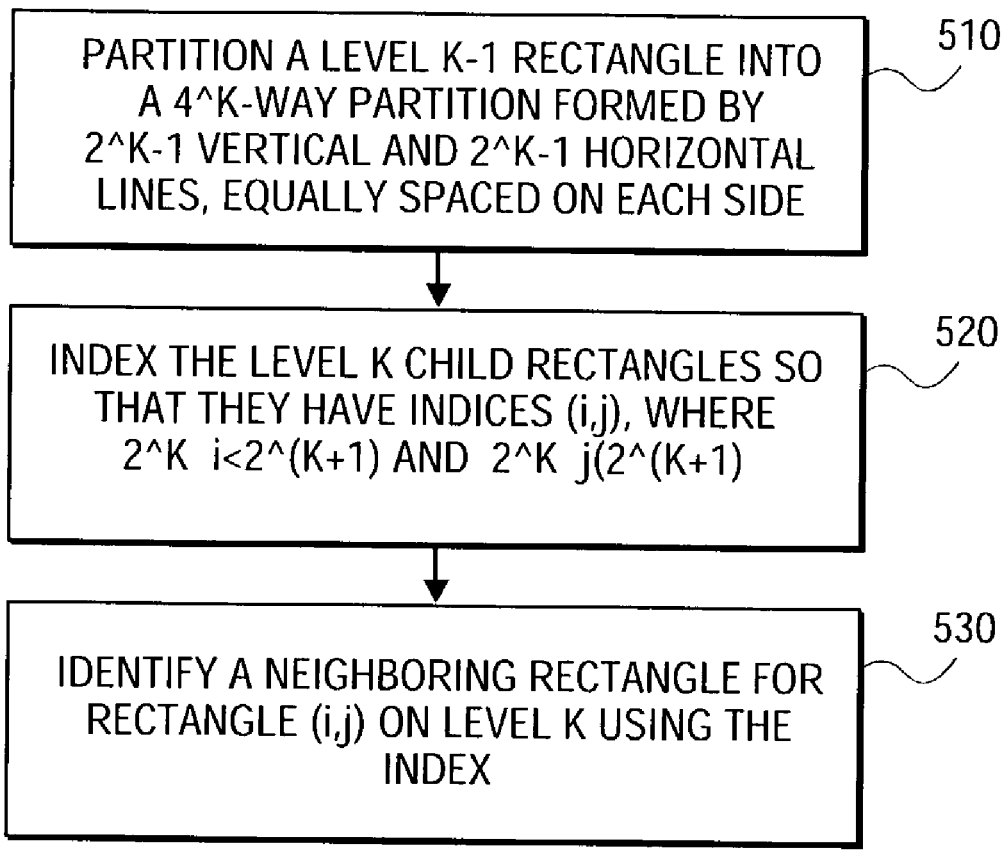
FIG. 5 shows an example of a method of generating level k child rectangles from a set of level k−1 parent rectangles to produce a hierarchy of gcells.

In general, as shown in FIG. 5, a method of generating level k child rectangles from a set of level k-1 parent rectangles, where k is an integer, may be performed. For example, a set of level k-1 rectangles may be partitioned into a 4^k-way partition formed by 2^k-1 vertical and 2^k-1 horizontal lines, equally spaced on each side, 510. The level k child rectangles may be indexed so that they to have indices (i, j), where 2^k<=i<2^(k+1) and 2^k<=j<2^(k+1); and the parent of (i, j) is (i/2, j/2), where the division by 2 is an integer division, 520. A neighboring rectangle for rectangle (i, j) on level k may be identified by using the index, 530. For example, identifying a west neighbor as (i−1, j), an east neighbor as (i+1, j), a north neighbor as (i, j+1), and a south neighbor as (i, j−1), may be performed.

In the examples of hierarchical gcells discussed above, the use of the number 2 to divide a gcell into a 2 by 2 grid of smaller gcells is illustrative of one embodiment of an indexing scheme. In general, a subdivision scheme may divide a level zero rectangle into a grid of S by T rectangles, where S is the number of rows, S-1 is the number of horizontal lines in the division, T is the number of columns and T-1 is the number of vertical rectangles in the division.

A property of the S by T grid has is that the neighbor, child, and parent relationships can be determined by an S by T indexing scheme.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A method of analyzing a design of an electronic circuit comprising:
   tessellating the design into a grid of rectangles;
   selecting at least one rectangle as a first level parent rectangle;
   generating a plurality of second level child rectangles based on the first level parent rectangle;
   generating a first index map n for the first level parent rectangle; and
   generating a second index map 2n for the plurality of second level child rectangles.

2. The method of claim 1, wherein generating further comprises:
   sub-dividing the first level parent rectangle to produce a plurality of second level child rectangles; and
   establishing a hierarchical relationship between the first level parent rectangle and the plurality of second level child rectangles.

3. The method of claim 2, wherein the first index map n and the second index map 2n are used to establish the hierarchical relationship.

4. The method of claim 1 further comprising:
   selecting at least one second level child rectangle as a second level parent rectangle; and
   generating a plurality of third level child rectangles based on the second level parent rectangle.

5. The method of claim 1, further comprising:
   generating a plurality of level k child rectangles based on a level k−1 parent rectangle, where k is an integer.

6. The method of claim 5, wherein generating a plurality of level k rectangles further comprises:
   partitioning level k−1 rectangles into a 4^k-way partition formed by 2^k-1 vertical and 2^k-1 horizontal lines, equally spaced on each side.

7. The method of claim 5, further comprising:
   indexing the level k child rectangles to have indices (i, j), where 2^k<=i<2^(k+1) and 2^k<j<2^(k+1), the index for the level k−1 parent rectangle of (i, j) is (i/2, j/2), where each of i/2, j/2 is an integer.

8. The method of claim 7, further comprising:
   identifying a neighboring rectangle of (i, j) on level k by using an index.

9. The method of claim 8, wherein identifying a neighboring rectangle of (i, j) further comprises:
   identifying a west neighbor as (i−1, j), an east neighbor as (i+1, j), a north neighbor as (i, j+1), and a south neighbor as (i, j−1).

10. A method of analyzing a design of an electronic circuit comprising:
    tessellating a first layer of the design into a plurality of rectangles;
    associating a vertex and edges with each rectangle;
    for each pair of neighboring rectangles, identifying a shared edge;
    associating a vertex with the shared edge;

tessellating the first layer of the design into a first plurality of rectangular blocks;
identifying a second layer of the design that neighbors the first layer; and
tessellating the second layer of the design into a second plurality of rectangular blocks.

11. The method of claim 10, wherein the vertex of each rectangle corresponds to a center of each associated rectangle.

12. The method of claim 10, wherein the vertex of the shared edge corresponds to the center of the shared edge.

13. The method of claim 10, wherein the shared edge is a one-dimensional object.

14. The method of claim 10, further comprising:
for each pair of neighboring blocks, where a first block in the pair is from the first plurality of rectangular blocks, and a second block in the pair is from the second plurality of rectangular blocks, identifying a shared rectangular edge; and
representing the shared rectangular edge with a vertex and edge boundaries.

15. An apparatus for analyzing a design of an electronic circuit comprising:
means for tessellating the design into a grid of rectangles;
means for selecting at least one rectangle as a first level parent rectangle;
means for generating a plurality of second level child rectangles based on the first level parent rectangle;
means for generating a first index map n for the first level parent rectangle; and
means for generating a second index map 2n for the plurality of second level child rectangles.

16. The apparatus of claim 15, wherein said means for generating further comprises:
means for sub-dividing the first level parent rectangle to produce a plurality of second level child rectangles; and
means for establishing a hierarchical relationship between the first level parent rectangle and the plurality of second level child rectangles.

17. The apparatus of claim 16, wherein the first index map n and the second index map 2n are used to establish the hierarchical relationship.

18. The apparatus of claim 15 further comprising:
means for selecting at least one second level child rectangle as a second level parent rectangle;
means for generating a plurality of third level child rectangles based on the second level parent rectangle.

19. The apparatus of claim 15, further comprising:
means for generating a plurality of level k child rectangles based on a level k−1 parent rectangle, where k is an integer.

20. The apparatus of claim 19, wherein said means for generating a plurality of level k rectangles further comprises:
means for partitioning level k−1 rectangles into a 4^k-way partition formed by 2^k−1 vertical and 2^k−1 horizontal lines, equally spaced on each side.

21. The apparatus of claim 19, further comprising:
means for indexing the level k child rectangles to have indices (i, j),
where $2^k <= i < 2^{(k+1)}$ and $2^k <= j < 2^{(k+1)}$, the index for the level k−1 parent rectangle of (i, j) is (i/2, j/2), where each of i/2, j/2 is an integer.

22. The apparatus of claim 21, further comprising:
means for identifying a neighboring rectangle of (i, j) on level k by using an index.

23. The apparatus of claim 22, wherein said means for identifying a neighboring rectangle of (i, j)further comprises:
means for identifying a west neighbor as (i−1, j), an east neighbor as (i+1, j), a north neighbor as (i, j+1), and a south neighbor as (i, j−1).

24. An apparatus for analyzing a design of an electronic circuit comprising:
means for tessellating a first layer of the design into a plurality of rectangles;
means for associating a vertex and edges with each rectangle;
means for identifying a shared edge for each pair of neighboring rectangles;
means for associating a vertex with the shared edge;
means for tessellating the first layer of the design into a first plurality of rectangular blocks;
means for identifying a second layer of the design that neighbors the first layer of the design; and
means for tessellating the second layer of the design into a second plurality of rectangular blocks.

25. The apparatus of claim 24, wherein the vertex of each rectangle corresponds to a center of each associated rectangle.

26. The apparatus of claim 24, wherein the vertex of the shared edge corresponds to the center of the shared edge.

27. The apparatus of claim 24, wherein the shared edge is a one-dimensional object.

28. The apparatus of claim 24, further comprising:
means for identifying a shared rectangular edge for each pair of neighboring blocks, where a first block in the pair is from the first plurality of rectangular blocks, and a second block in the pair is from the second plurality of rectangular blocks; and
means for representing the shared rectangular edge with a vertex and edge boundaries.

29. An article of manufacture comprising a computer readable medium storing instructions which, when executed by a processing system, cause the processing system to perform a method of analyzing a design of an electronic circuit, the method comprising:
tessellating the design into a grid of rectangles;
selecting at least one rectangle as a first level parent rectangle;
generating a plurality of second level child rectangles based on the first level parent rectangle;
generating a first index map n for the first level parent rectangle; and
generating a second index map 2n for the plurality of second level child rectangles.

30. The computer readable medium of claim 29, wherein the instructions, when executed, cause the processing system to perform generating by:
sub-dividing the first level parent rectangle to produce the plurality of second level child rectangles; and
establishing a hierarchical relationship between the first level parent rectangle and the plurality of second level child rectangles.

31. The computer readable medium of claim 30, wherein the first index map n and the second index map 2n are used to establish the hierarchical relationship.

32. The computer readable medium of claim 29, wherein the instructions, when executed, cause the processing system to perform the method further comprising:
selecting at least one second level child rectangle as a second level parent rectangle; and generating a plurality of third level child rectangles based on the second level parent rectangle.

33. The computer readable medium of claim 29, wherein the instructions, when executed, cause the processing system to perform the method further comprising:

generating a plurality of level k child rectangles based on a level k−1 parent rectangle, where k is an integer.

34. The computer readable medium of claim 33, wherein the instructions, when executed, cause the processing system to perform generating a plurality of level k rectangles by:

partitioning level k−1 rectangles into a 4^k-way partition formed by 2^k−1 vertical and 2^k−1 horizontal lines, equally spaced on each side.

35. The computer readable medium of claim 33, wherein the instructions, when executed, cause the processing system to perform the method further comprising:

indexing the level k child rectangles to have indices (i, j), where 2^k<=i<2^(k+1) and 2^k<=j<2^(k+1), the index for the level k−1 parent rectangle of (i, j) is (i/2, j/2), where each of i/2, j/2 is an integer.

36. The computer readable medium of claim 35, wherein the instructions, when executed, cause the processing system to perform the method further comprising:

identifying a neighboring rectangle of (i, j) on level k by using an index.

37. The computer readable medium of claim 36, wherein the instructions, when executed, cause the processing system to perform identifying a neighboring rectangle of (i, j) by:

identifying a west neighbor as (i−1, j), an east neighbor as (i+1, j), a north neighbor as (i, j+1), and a south neighbor as (i, j−1).

38. An article of manufacture comprising a computer readable medium storing instructions which, when executed by a processing system, cause the processing system to perform a method of analyzing a design of an electronic circuit, the method comprising:

tessellating a first layer of the design into a plurality of rectangles;

associating a vertex and edges with each rectangle;

for each pair of neighboring rectangles, identifying a shared edge; associating a vertex with the shared edge;

tessellating the first layer of the design into a first plurality of rectangular blocks;

identifying a second layer of the design that neighbors the first layer of the design; and tessellating the second layer of the design into a second plurality of rectangular blocks.

39. The computer readable medium of claim 38, wherein the vertex of each rectangle corresponds to a center of each associated rectangle.

40. The computer readable medium of claim 38, wherein the vertex of the shared edge corresponds to the center of the shared edge.

41. The computer readable medium of claim 38, wherein the shared edge is a one-dimensional object.

42. The computer readable medium of claim 38, wherein the instructions, when executed, cause the processing system to perform the method further comprising:

for each pair of neighboring blocks, where a first block in the pair is from the first plurality of rectangular blocks, and a second block in the pair is from the second plurality of rectangular blocks, identifying a shared rectangular edge; and representing the shared rectangular edge with a vertex and edge boundaries.

* * * * *